United States Patent
Veneklasen et al.

[11] Patent Number: 5,900,667
[45] Date of Patent: *May 4, 1999

[54] OPERATING A SOLID STATE PARTICLE DETECTOR WITHIN A MAGNETIC DEFLECTION FIELD SO AS TO MINIMIZE EDDY CURRENTS

[75] Inventors: Lee H. Veneklasen, Castro Valley; Rudy F. Garcia, Newark, both of Calif.

[73] Assignee: Etec Systems, Inc., Hayward, Calif.

[*] Notice: This patent issued on a continued prosecution application filed under 37 CFR 1.53(d), and is subject to the twenty year patent term provisions of 35 U.S.C. 154(a)(2).

[21] Appl. No.: 08/726,449

[22] Filed: Oct. 4, 1996

[51] Int. Cl.[6] .......................... H01L 31/115; H01L 27/14; H01L 31/00; G01J 1/20

[52] U.S. Cl. .............. 257/429; 250/370.01; 250/370.08; 250/370.09; 257/428; 257/680; 378/189

[58] Field of Search .................. 250/370.01, 370.08, 250/370.09; 257/414, 425, 428, 429, 433, 678, 680, 788, 789; 378/189, 190

[56] References Cited

U.S. PATENT DOCUMENTS

| | | | |
|---|---|---|---|
| 4,897,545 | 1/1990 | Danilatos | 250/310 |
| 5,032,724 | 7/1991 | Gerlach et al. | 250/305 |
| 5,051,600 | 9/1991 | Schuetz et al. | 250/492.3 |
| 5,317,617 | 5/1994 | Lange | 378/65 |
| 5,387,795 | 2/1995 | Kuzay et al. | 250/336.1 |
| 5,391,874 | 2/1995 | Ellis | 250/336 |
| 5,481,109 | 1/1996 | Ninomiya et al. | 250/310 |
| 5,497,098 | 3/1996 | Heil et al. | 324/637 |

*Primary Examiner*—Mahshid Saadat
*Assistant Examiner*—Allan R. Wilson
*Attorney, Agent, or Firm*—Skjerven, Morrill, MacPherson, Franklin & Friel LLP; Norman R. Klivans

[57] ABSTRACT

A solid state electron or x-ray detector is mounted within the time-varying magnetic deflection fields of a charged particle beam system. A minimum volume of high resistivity conductors and insulating materials are used in the mounting to minimize eddy currents that otherwise cause dynamic deflection distortions. Segmented conductive elastomer members make electrical and mechanical contact with the active surface of the detector. A flexible PC board connects the detector active areas to external signal processing electronics.

8 Claims, 2 Drawing Sheets

OPERATING A SOLID STATE PARTICLE DETECTOR WITHIN A MAGNETIC DEFLECTION FIELD SO AS TO MINIMIZE EDDY CURRENTS

BACKGROUND OF THE INVENTION

1. Field of the Invention

This invention relates to charged particle beam systems and more particularly to a detector for detecting back scattered and secondary particles in such a system.

2. Description of the Prior Art

Electron beam lithography and inspection systems, scanning electron microscopes and other particle optics systems usually use a magnetic objective "lens" to focus a charged particle beam upon a substrate. Magnetic deflection systems are often used to position (deflect) these beams on the substrate. A static magnetic lens focus field and time varying magnetic deflection field are often superimposed and located as near as possible to the substrate in order to minimize axial lens aberrations and deflection distortions.

The same particle optics systems often include annular shaped detectors that detect secondary particles and x-rays coming from the substrate area irradiated by the primary beam. In conjunction with a raster or vector scanned particle beam, these secondary particles are used to form images or to identify the composition of the substrate. In the case of electron beam lithography, inspection or ion beam milling tools, secondary or backscattered electron or ion detected images are also used for registering the beam position with respect to the substrate. To maximize these detection signals, it is important for the detector to subtend a large solid angle when viewed from the substrate. Thus the detector as well as the lens and deflection coils should be close to the substrate.

Thus the region between an objective lens/deflection system and substrate must include lens, deflection, and detector elements. It is particularly desirable that the lens, deflection and detection functions are superimposed to minimize the space that they occupy.

Annular shaped solid state detectors are known in particle beam systems. Sometimes it is necessary to separately record signals from different azimuthal angles to gain more information about the substrate geometry, so such annular detectors with several individual detectors (active areas) on a single detector substrate are also used. Typically such a detectors consist of planar diode structures on a thin substrate of high purity doped silicon. Each detector segment (active area) is a thin doped layer covered with an even thinner conductive coating. A bias voltage is applied to the opposing back surface, creating a depletion layer in the silicon. High energy particles penetrate into a depletion region, forming many electron hole pairs that, when extracted, are an amplified version of the incident current signal.

SUMMARY

This invention is directed to mounting a detector within a magnetic lens and deflection field to minimize the distance between lens and substrate. The detectors thereby are accommodated along with low lens and deflection aberrations, leading to improved system performance.

In accordance with this invention, a segmented solid state detector assembly is located within the pole pieces of a composite objective lens/deflection assembly. Location of the detector within a magnetic lens and deflection field introduces special problems found by us, and also addressed herein. To avoid distortion of the static lens magnetic field, all detector and mounting materials are non-magnetic with a permeability very close to that of vacuum. If the deflection field is of the type to change rapidly in-order to position the beam at high bandwidth, then there are additional problems to be solved. Changing magnetic fields induce eddy currents in conductive materials, creating opposing magnetic fields that oppose the deflection field until they resistively decay. The magnitude of these eddy current "settlers" depends upon the volume and electrical resistivity of materials within the deflection field, and their proximity to the beam. Thus since the present detector is located within the deflection fields, the volume of conductive material is minimized, and the electrical resistivity is as high as possible consistent with appropriate electrical connection to the detector elements.

Electrical and mechanical contact to the active areas of the detector is achieved by segments of a conductive elastomer material that is soft and so does not damage the active area surface. The actual detector is sandwiched between these segments and a thin backing ring on the opposite side, that is also of relatively high resistivity material. Electrical connection to external circuitry, e.g., pre-amplifiers et al., is made through special high resistivity screws and a flexible printed circuit board assembly that minimize the volume and maximize the resistivity of all materials subject to the eddy currents. This mounting approach minimizes eddy current settlers in the system.

BRIEF DESCRIPTION OF THE DRAWINGS

FIG. 2A is along line A—A of FIG. 2B.

DETAILED DESCRIPTION

Figure 1:
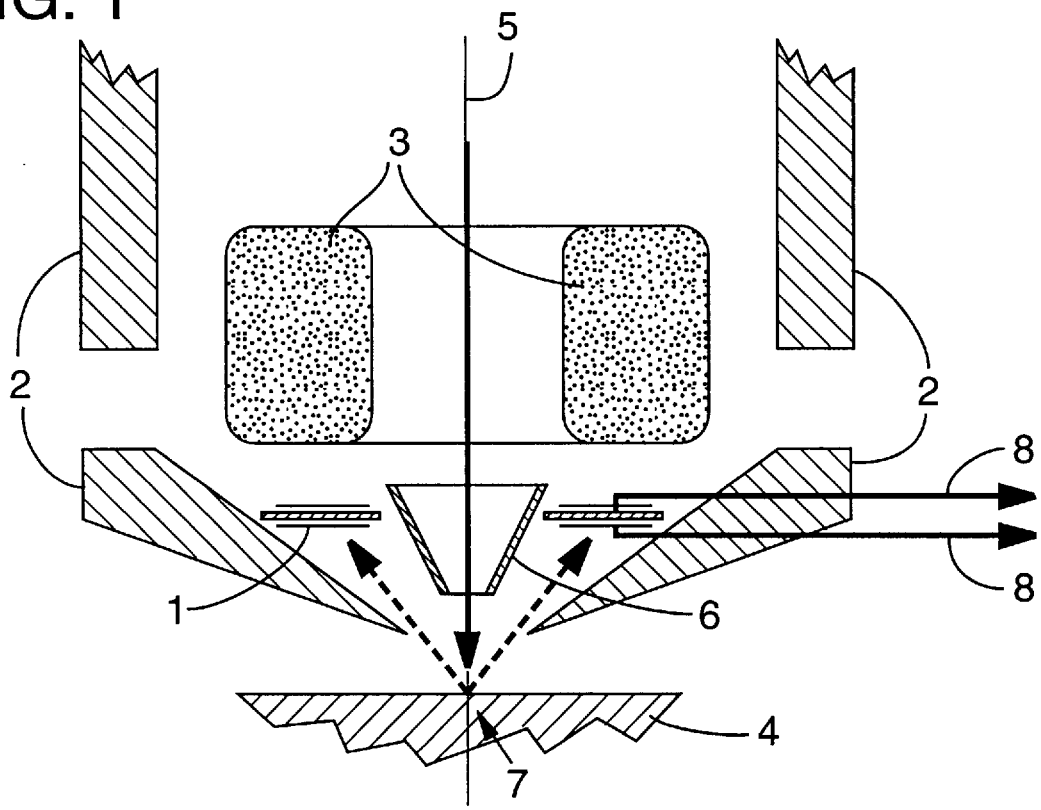
FIG. 1 shows in cross-section one embodiment of the present segmented solid state detector mounted within a magnetic lens and deflection system.

FIG. 1 illustrates in cross-section the present solid state detector assembly in a magnetic lens and deflection system. A thin, annular conventional solid state detector 1 with one or more active detection areas lies within the conical shaped ferrite lower pole pieces 2 of a particle beam objective magnetic lens. The detector assembly (the detector and its housing but the housing is not shown) is located just below saddle or toroidal magnetic deflection coils 3 which rapidly deflect the beams to various sites upon a substrate 4. The detector 1 active (lower) surface is shielded from the primary beam 5 (provided from a source, not shown) by a conical shaped baffle 6, but an annular region of the detector faces the part 7 of the substrate 4 irradiated by the particle beam. The baffle 6 is described in further detail in U.S. patent application Ser. No. 08/733,673, entitled "Conical Baffle For Reducing Charging Drift In Particle Beam System", inventors Lee H. Veneklasen and Lydia J. Young, now U.S. Pat. No. 5,838,006, issued Nov. 17, 1998 incorporated herein by reference; however such a baffle is not necessary for use of the present invention. Also, the conical shaped pole pieces are disclosed in U.S. patent application Ser. No. 08/721,287, entitled "Concentric-Gap Magnetic Lens With Conical Pole Pieces", inventors Lee H. Veneklasen and William J. Devore now U.S. Pat. No. 5,729,022, issued Mar. 17, 1998, incorporated herein by reference. The underlying support, e.g. stage, for the substrate 4 is conventional and not shown. Several conductors 8 (shown schematically) lead outside the pole piece enclosure 2, electrically connecting the detector 1 to external video or other signal processing electronics (not shown). The present mounting does not require a conical pole piece; for instance, in FIG. 1 one could omit the baffle 6 and provide equal diameter upper and lower pole pieces and still use the present detector assembly.

Figure 2B:
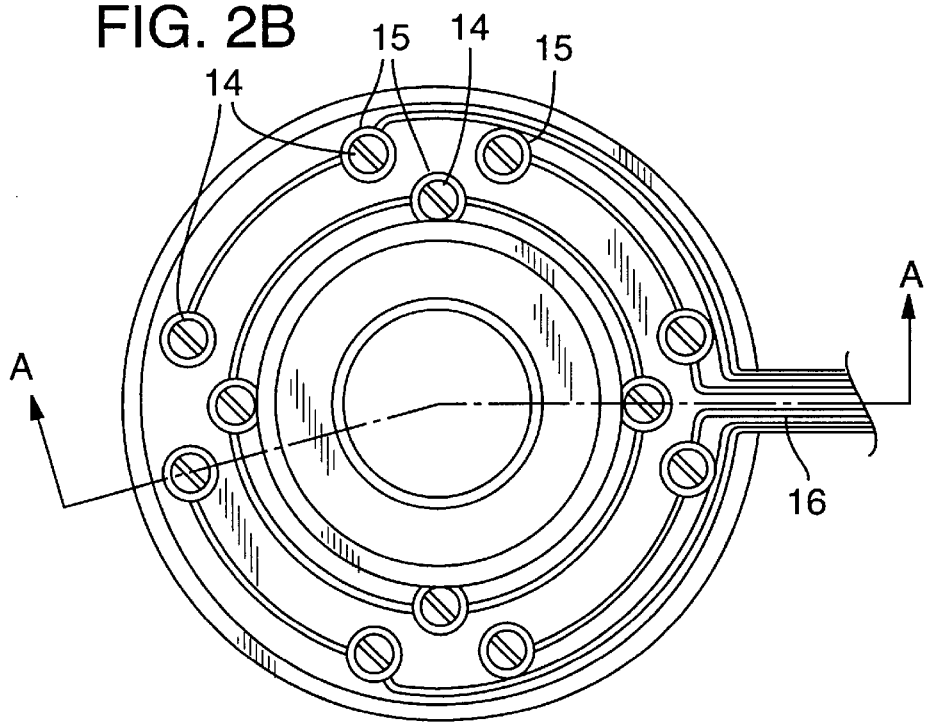
FIG. 2B shows a top view of the structure of FIG. 2A.
Figure 2A:
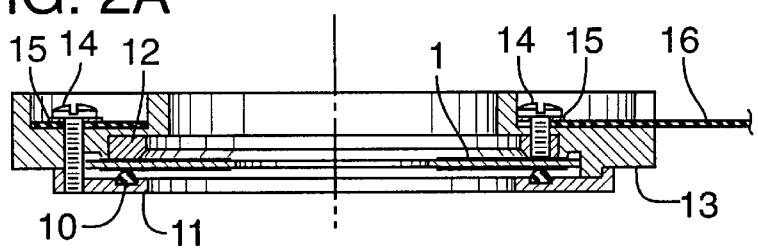
FIG. 2A shows in cross-section a detector mount in accordance with this invention.

FIG. 2A shows in a cross sectional view several aspects of the present detector assembly to minimize eddy current losses in the detector assembly; these eddy currents would otherwise undesirably reduce deflection bandwidth. Contact to the active areas on the lower surface of the detector 1 is via conductive elastomer members 10. Each elastomer member 10 is an arc shaped segment, e.g., cut from a single round or rectangular O-ring and inserted in a shallow groove on the similarly segmented conductive signal contact rings 11. The soft surface of elastomer members 10 makes adequate electrical contact to the active areas of detector 1 without damaging the active areas. The resistivity of the elastomer members 10 is low enough to conduct signals of milliamperes without significant voltage drop, but high enough to discourage eddy currents. The silicon detector 1 is of conventional configuration as described above, except it has four quadrants (active areas) as illustrated below.

The thin silicon detector 1 is sandwiched between the elastomer members 10 and a thin backing ring 12 that contacts the other (back) surface of the detector 1. Ring 12 is of e.g. titanium, pyrolitic graphite or an elastomer and makes the bias electrical contact with the aluminized layer on the back surface of detector 1, and also provides mechanical support to avoid cracking the brittle silicon detector 1 with the concentrated force of the active area contacts 10. An insulating base 13 provides a mount (housing) for the detector assembly. Several very small screws 14 and associated washers 15 (heads of screws 14 are shown in the bottom view of FIG. 2A) are machined of relatively high resistivity metal (such as titanium). Screws 14 and washers 15 (or equivalent fasteners) provide the mechanical force to hold together the detector assembly, and also make electrical connection to a flexible printed circuit board assembly 16 that carries the electrical connections (designated 8 on FIG. 1) externally.

Figure 2C:
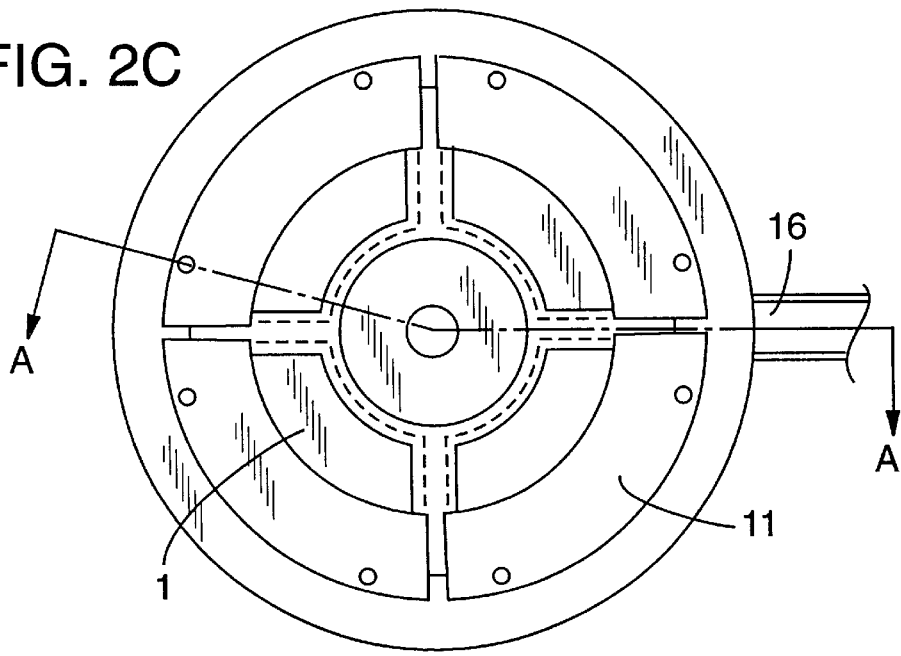
FIG. 2C shows a bottom view of the structure of FIG. 2A.

FIGS. 2B and 2C respectively show a top and a bottom view of the structure of FIG. 2A; FIG. 2A is along line A—A of FIGS. 2B and 2C. All surfaces shown in FIG. 2C are of conductive or material or are conductive-coated.

Figure 3A:
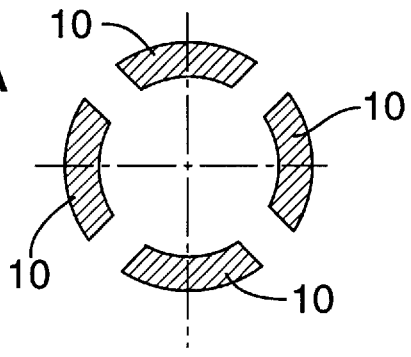
FIG. 3A shows in a plan view detail of the segmented elastomer members.
Figure 3B:
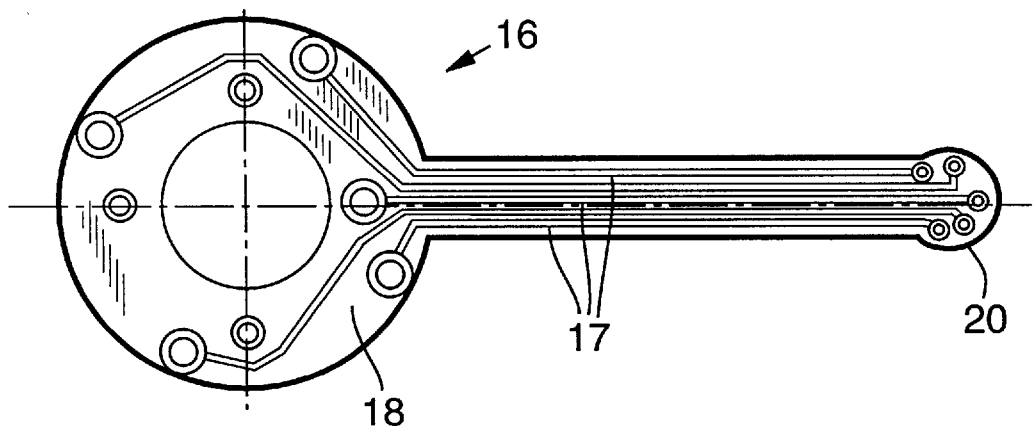
FIG. 3B shows in a plan view the flexible PC board connection lead of FIG. 2A.

FIGS. 3A and 3B show respectively the four "segmented" elastomer members 10 and associated flexible PC board 16 in more detail in a plan view. Flexible PC boards are well known in electronics, having thin copper traces 17 bonded between layers of thin polyimide film 18. In this case, exposed conductive vias make electrical contact with the screws 14 through thin washers 15 of FIG. 2A. The other end of the flexible PC contact assembly 16 terminates in a header 20 that in turn is connected electrically to the pre-amplifiers and other external electronics (not shown).

Along with conductive elastomer, high resistivity non-magnetic parts in this detector assembly are of metals such as silicon bronze, molybdenum, titanium etc. The insulating detector base 13 is of e.g. ceramic or a stiff plastic material such as polyimide. The materials used in the silicon detector 1 itself are sufficiently resistive so as not to be prone to eddy current effects.

This assembly is especially advantageous when such a detector is located within a high bandwidth magnetic deflection field. Minimum volume and high resistivity are two elements that lead to minimum eddy current losses and more accurate high speed deflection. Also in the illustrated embodiment all the detector assembly parts facing the substrate are conductive. Thus there is no possibility of these parts holding any charge which would interfere with the electron beam. Also, the detector assembly in the illustrated embodiment includes no soldered connections to minimize metal in the magnetic field.

This disclosure is illustrative and not limiting; further modifications will be apparent to one skilled in the art in light of this disclosure, and are intended to fall within the scope of the appended claims.

We claim:

1. A method of operating a particle beam system, comprising:
    generating a beam of charged particles;
    passing the beam through a concentric magnetic lens having time varying magnetic fields, so the beam is incident on a substrate;
    detecting secondary particles from the substrate generated by the incident beam, the detecting being at a location within the magnetic lens using a detector having a semiconductor detection plate operable to detect the secondary particles from the substrate, the detection plate having a surface directly exposed to the substrate, the detector further having a signal contact plate having a conductive, high resistivity metal composition, the detector further having a conductive, flexible elastomer member sandwiched between the detection plate and the signal contact plate.

2. The method of claim 1, wherein all surfaces of the detector facing the substrate are conductive.

3. The method of claim 1, wherein the conductive material of the detector is one of a group consisting of silicon bronze, molybdenum, and titanium.

4. The method of claim 1, further comprising electrically coupling the detector to a flexible printed circuit.

5. A particle beam system for impinging a charged particle beam on a substrate and detecting secondary particles from the substrate, the particle beam system comprising:
    a magnetic particle deflection system operable to deflect particles in the charged particle beam, the magnetic particle deflection system having time varying magnetic fields;
    a detector located within the magnetic particle deflection system, the detector having at least one surface directly exposed to the substrate, wherein every surface directly exposed to the substrate is conductive, the detector further having:
a semiconductor detection plate operable to detect the secondary particles from the substrate, the detection plate having a surface directly exposed to the substrate;
a signal contact plate having a conductive, high resistivity metal composition;
a conductive, flexible elastomer member sandwiched between the detection plate and the signal contact plate.

6. The particle beam system of claim 5, wherein the detector further comprises a plurality of physical connections, and wherein none of the physical connections of the detector comprises solder.

7. The particle beam system of claim 5, wherein the conductive, high resistivity metal composition of the signal contact plate is selected from a group consisting of silicon bronze, molybdenum and titanium.

8. The particle beam system of claim 5, wherein the conductive, high resistivity metal composition of the signal contact plate has a resistivity between 3 and 6 microhm-centimeters.

* * * * *